United States Patent
Yang

(10) Patent No.: US 8,119,523 B2
(45) Date of Patent: Feb. 21, 2012

(54) METHOD FOR FABRICATING SEMICONDUCTOR DEVICE USING DUAL DAMASCENE PROCESS

(75) Inventor: Jin-Ho Yang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 63 days.

(21) Appl. No.: 12/432,858

(22) Filed: Apr. 30, 2009

(65) Prior Publication Data

US 2010/0015803 A1 Jan. 21, 2010

(30) Foreign Application Priority Data

Jul. 17, 2008 (KR) .................. 10-2008-0069538

(51) Int. Cl.
*H01L 21/4763* (2006.01)
(52) U.S. Cl. ................ 438/637; 257/E21.579
(58) Field of Classification Search .......... 438/637; 257/E21.579
See application file for complete search history.

(56) References Cited

U.S. PATENT DOCUMENTS

| | | | |
|---|---|---|---|
| 5,173,442 A * | 12/1992 | Carey | 216/18 |
| 2003/0054629 A1 * | 3/2003 | Kawai et al. | 438/622 |
| 2004/0110370 A1 * | 6/2004 | Okayama et al. | 438/638 |
| 2004/0127016 A1 * | 7/2004 | Hoog et al. | 438/637 |
| 2005/0009324 A1 * | 1/2005 | Li et al. | 438/637 |
| 2006/0094234 A1 * | 5/2006 | Soda et al. | 438/638 |
| 2007/0275561 A1 * | 11/2007 | Jiang et al. | 438/695 |
| 2008/0233518 A1 * | 9/2008 | Nagahara et al. | 430/296 |

FOREIGN PATENT DOCUMENTS

| | | |
|---|---|---|
| KR | 100301148 | 11/2001 |
| KR | 100412195 | 12/2003 |
| KR | 100460771 | 12/2004 |

OTHER PUBLICATIONS

Notice of Preliminary Rejection issued from Korean Intellectual Property Office on Jun. 30, 2010 with English Translation.

* cited by examiner

*Primary Examiner* — Kevin Parendo
(74) *Attorney, Agent, or Firm* — IP & T Group LLP

(57) ABSTRACT

A method for fabricating a semiconductor device using a dual damascene process is provided. The method includes forming a dielectric layer over a conductive layer, forming a via hole exposing the conducting layer by selectively etching the dielectric layer, projecting a portion of the dielectric layer at an edge of the via hole by selectively etching the dielectric layer to a first depth, and forming a trench by selectively etching the dielectric layer to a second depth, wherein the trench is overlapped with the via hole to form a dual damascene pattern.

9 Claims, 8 Drawing Sheets

METHOD FOR FABRICATING SEMICONDUCTOR DEVICE USING DUAL DAMASCENE PROCESS

CROSS-REFERENCE TO RELATED APPLICATIONS

The present invention claims priority of Korean patent application number 10-2008-0069538, filed on Jul. 17, 2008, which is incorporated by reference in its entirety.

BACKGROUND OF THE INVENTION

The present invention relates to technology for fabricating a semiconductor device, and more particularly, to a method for fabricating a semiconductor device which uses a dual damascene process.

As a degree of integration of a semiconductor device increases, a new trial of using copper (Cu) instead of aluminum (Al) or tungsten (W) as a material for metallization has continued since the resistivity of the copper is approximately 60% of that of the aluminum.

However, since it is difficult to etch the copper, a damascene process is introduced to overcome the problem.

The damascene process is technology of forming a trench in a region where a line is to be formed through a photolithography process for a dielectric layer and then filling the trench with a conducting material such as Al, W and Cu for the line formation, thereby forming a line in a shape of the trench.

Recently, a dual damascene process has been introduced. Thus, a trench for the line formation as well as a via hole connecting an upper line and a lower line can be formed through the dual damascene process. The dual damascene process is classified into a via first scheme and a trench first scheme.

FIGS. 1A to 1D illustrate cross-sectional view explaining a dual damascene process having the via first scheme according to the prior art.

Referring to FIG. 1A, an inter-layer dielectric layer 11 is formed on a conducting layer 10. The conducting layer 10 may include a plug, a metal line or a semiconductor substrate.

Then, a first photoresist pattern 12 for forming a via hole is formed on the inter-layer dielectric layer 11. Herein, a reference numeral 'V' represents a region where the via hole is to be formed.

Referring to FIG. 1B, after forming the via hole 13 exposing the conducting layer 10 by etching the inter-layer dielectric layer 11 using the first photoresist pattern 12 as an etch barrier, the first photoresist pattern 12 is removed.

Referring to FIG. 1C, an anti-reflection layer 14 is formed to have a thickness as much as filling the via hole 13 on a whole surface of a resultant structure including the via hole 13. The anti-reflection layer 14 prevents the light from being reflected in an exposure process of the photoresist and, at the same time, serves as a barrier to prevent the conducting layer 10 exposed according to the formation of the via hole 13 from being damaged.

Subsequently, a second photoresist pattern 15 used for forming a trench is formed on the anti-reflection layer 14. Herein, a reference numeral 'T' represents a region where the trench is to be formed and the via hole 13 is overlapped with the region T. That is, the via hole 13 is disposed under the region T.

Referring to FIG. 1D, the trench 16 is formed by etching the inter-layer dielectric layer 11 up to a certain depth using the second photoresist pattern 15 as an etch barrier. As a result, a dual damascene pattern 100 including the trench 16 and the via hole 13 overlapped within the trench 16 is formed in the inter-layer dielectric layer 11.

Then, although it is not shown, a line having a shape of the dual damascene pattern 100 may be formed in the inter-layer dielectric layer 11 by depositing a conducting layer for the line formation such as copper on a whole surface of a resultant structure including the dual damascene pattern 100 and performing a planarization process such as a chemical mechanical polishing (CMP) process until the inter-layer dielectric layer 11 is exposed.

However, the dual damascene process of the via first scheme has following problems.

As described in a part X of FIG. 1C, the non-uniformity of a thickness of the anti-reflection layer 14 occurs in an edge region of the inter-layer dielectric layer 11 where the via hole 13 is formed during the process of forming the anti-reflection layer 14. Thus, since the inter-layer dielectric layer 11 around the via hole 13 collapses in the process of forming the trench 16 as shown in a part Y of FIG. 1D, it is difficult to obtain a desired profile of the trench 16 that is designated by a dotted line. Since this phenomenon makes the deposition of the conducting layer for the line formation unstable, a defect may occur or the line may be cut in the CMP process. Consequently, the above problems cause an electrical failure of a device and thus may deteriorate the reliability of the device.

SUMMARY OF THE INVENTION

Embodiments of the present invention are directed to providing a method for fabricating a semiconductor device employing a dual damascene process, capable of preventing a portion of a dielectric layer at an edge of a via hole from collapsing in a subsequent process of forming a trench by projecting the portion of the dielectric layer at the edge of the via hole than other portions.

In accordance with an aspect of the present invention, there is provided a method for fabricating a semiconductor device using a dual damascene process, the method including: forming a dielectric layer over a conductive layer; forming a via hole exposing the conducting layer by selectively etching the dielectric layer; projecting a portion of the dielectric layer at an edge of the via hole by selectively etching the dielectric layer to a first depth; and forming a trench by selectively etching the dielectric layer to a second depth, wherein the trench is overlapped with the via hole to thereby form a dual damascene pattern.

In accordance with another aspect of the present invention, there is provided a method for fabricating a semiconductor device using a dual damascene process, the method including forming a dielectric layer over a conductive layer; forming a via hole exposing the conducting layer by selectively etching the dielectric layer; projecting a portion of the dielectric layer at an edge of the via hole by selectively etching the dielectric layer to a first depth; and forming a trench by selectively etching the dielectric layer to a second depth to form a dual damascene pattern, wherein the selective etching includes etching the projecting portion and an area of the dielectric layer under the projecting portion.

DESCRIPTION OF SPECIFIC EMBODIMENTS

Figure 1A:
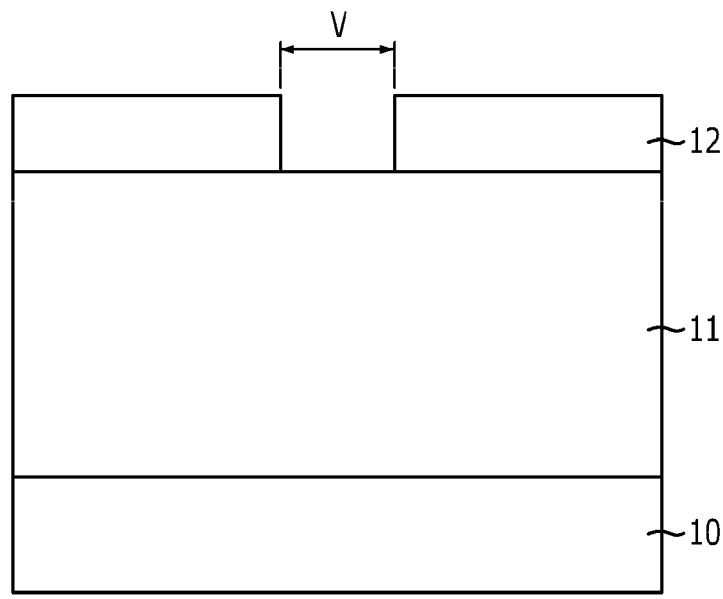
FIGS. 1A to 1D illustrate cross-sectional views explaining a dual damascene process having a via first scheme according to the prior art.
Figure 1B:
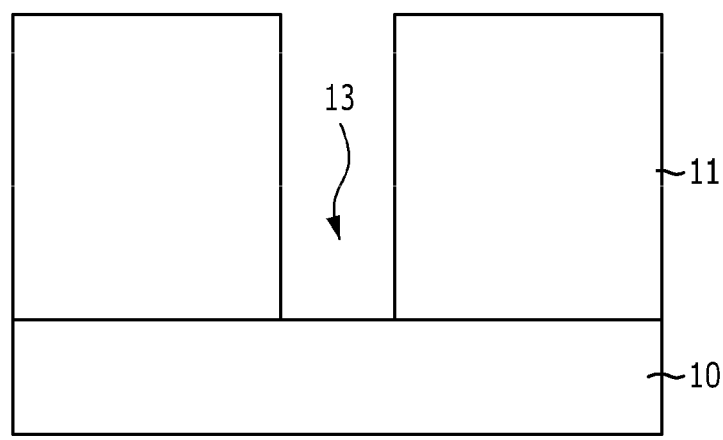
Figure 1C:
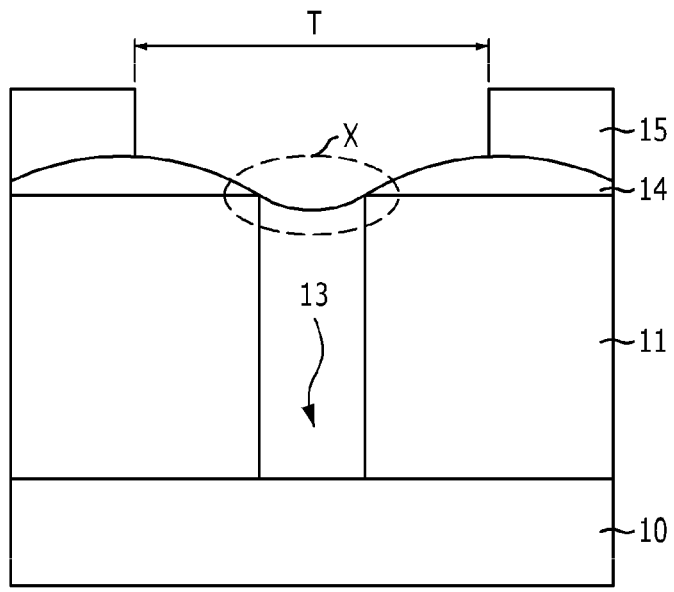
Figure 1D:
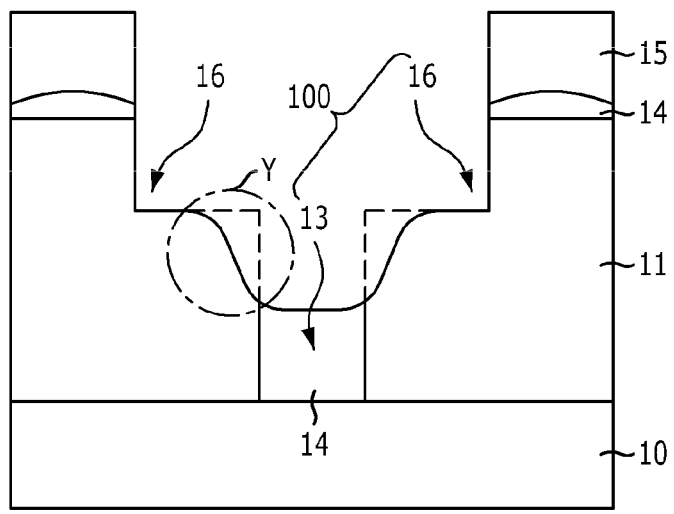

Other objects and advantages of the present invention can be understood by the following description, and become apparent with reference to the embodiments of the present invention. In the figures, the dimensions of layers and regions may be exaggerated for clarity of illustration. Like reference numerals refer to like elements throughout. It will also be understood that when a layer, a film, a region or a plate is referred to as being 'on' another one, it can be directly on the other one, or one or more intervening layers, films, regions or plates may also be present.

FIGS. 2A to 2I illustrate cross-sectional views explaining a dual damascene process having a via first scheme in accordance with an embodiment of the present invention.

Figure 2A:
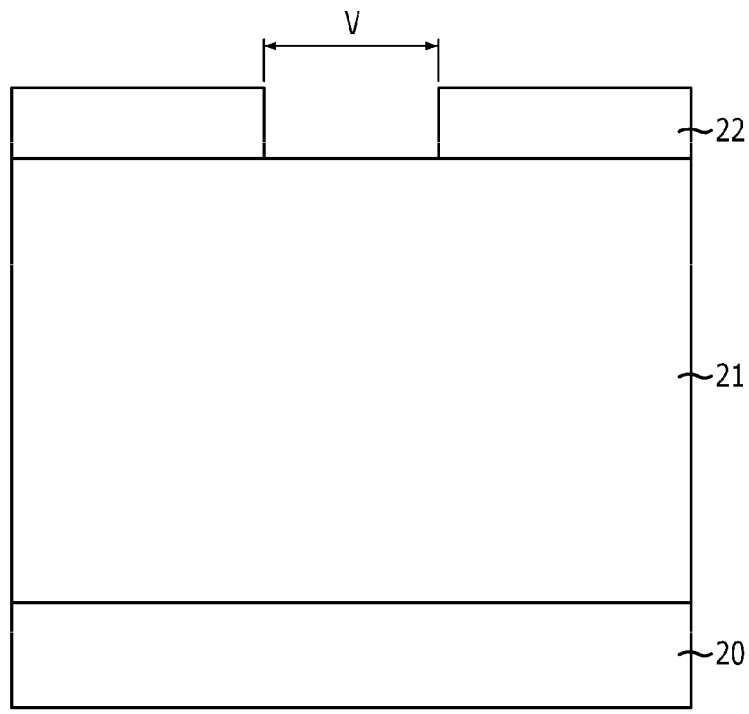
FIGS. 2A to 2I illustrate cross-sectional views explaining a dual damascene process having a via first scheme in accordance with an embodiment of the present invention.

Referring to FIG. 2A, an inter-layer dielectric layer 21 is formed on a conducting layer 20. The conducting layer 20 may be a plug, a metal line or a semiconductor substrate. The inter-layer dielectric layer 21 may be formed of an oxide series layer and have a thickness of approximately 8,000 Å to approximately 15,000 Å.

Then, a first photoresist pattern 22 for forming a via hole is formed on the inter-layer dielectric layer 21. Herein, a reference numeral 'V' represents a region where the via hole is to be formed. The process of forming the first photoresist pattern 22 is performed by coating positive photoresist on the inter-layer dielectric layer 21 and exposing and developing the positive photoresist through the use of a photo mask having an open pattern which light permeate in a region corresponding to the region where the via hole is to be formed. Although it is not shown, an anti-reflection layer and a hard mask layer including amorphous carbon may be disposed under the first photoresist pattern 22.

Figure 2B:
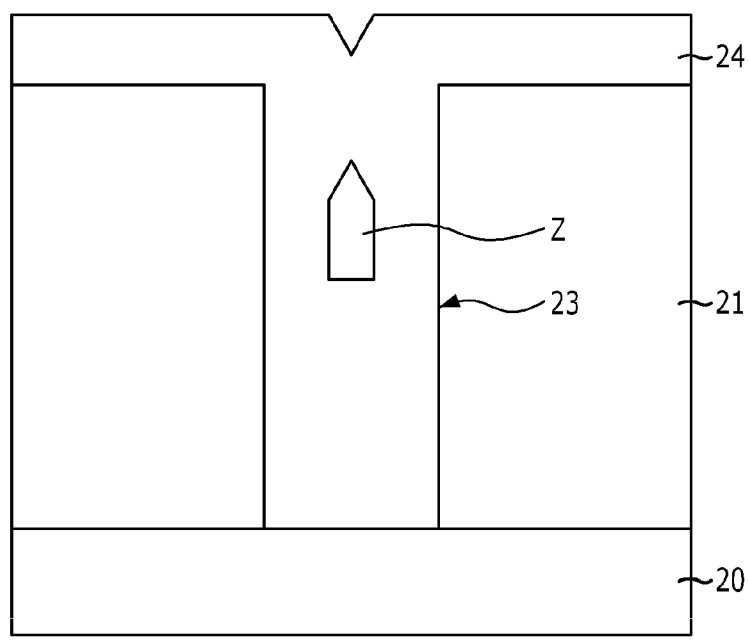

Referring to FIG. 2B, after forming the via hole 23 exposing the conducting layer 20 by etching the inter-layer dielectric layer 21 using the first photoresist pattern 22 as an etch barrier, the first photoresist pattern 22 is removed.

Subsequently, a first anti-reflection layer 24 filling the via hole 23 is formed on a whole surface of a resultant structure including the via hole 23. At this point, it is preferable to adjust a thickness of the first anti-reflection layer 24 to a level which a top surface of the first anti-reflection layer 24 is higher than that of the inter-layer dielectric layer 21 even in a region where the via hole 23 is disposed. This is for easily forming a subsequent second photoresist pattern. Although a void Z may be formed in the first anti-reflection layer 24 during the above process, the void Z is removed together with the first anti-reflection layer 24 in a subsequent process of etching the first anti-reflection layer 24. Thus, the void Z does not have any influence on the performance of the device.

Figures 1, 2C:
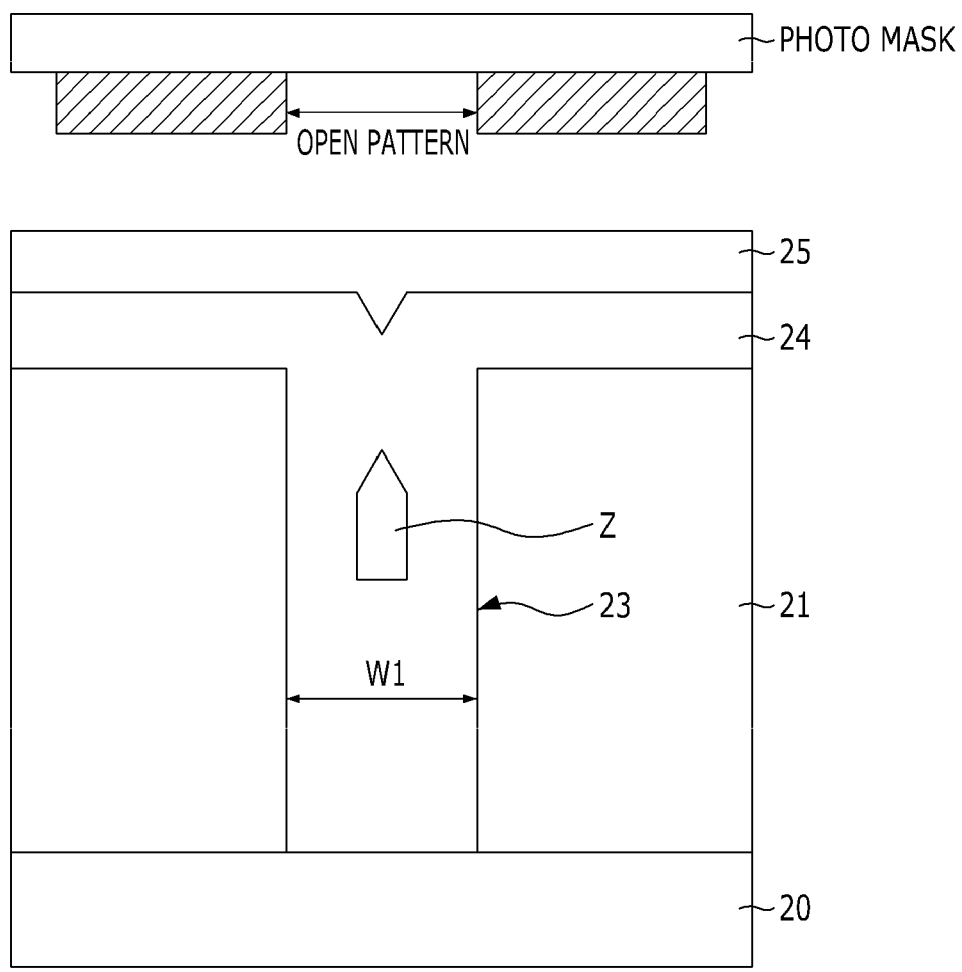
Figures 2, 2C:
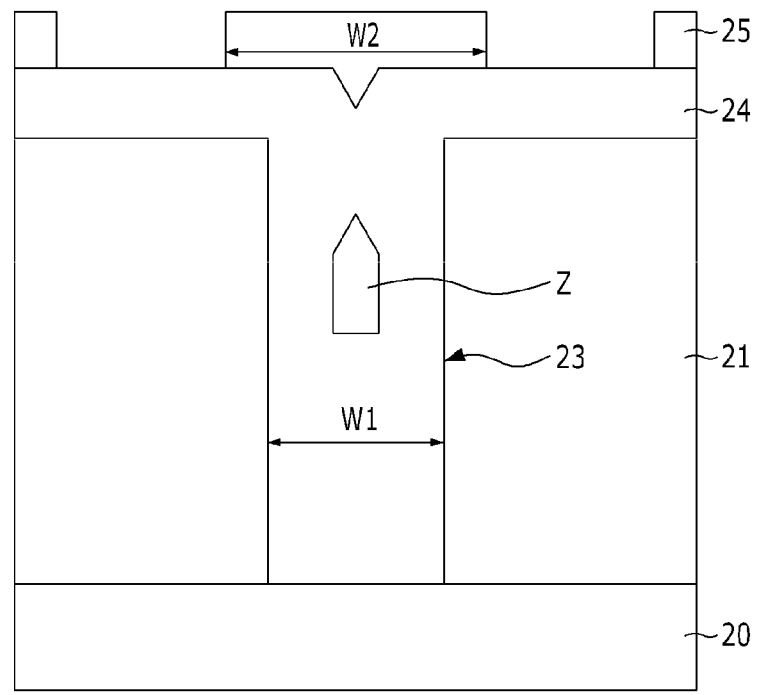

Referring to FIG. 2C-2, a second photoresist pattern 25 covering the via hole 23 is formed on the first anti-reflection layer 24. Herein, since the second photoresist pattern 25 is formed to have a width W2 greater than a width W1 of the via hole 23, the second photoresist pattern 25 can cover an edge of the via hole 23 as well as the via hole 23.

As described above, the process of forming the second photoresist pattern 25 may be performed using a photo mask that is the same as that used in the process of forming the first photoresist pattern 22. As shown in FIG. 2C-1, the process of forming the second photoresist pattern 25 is performed by coating negative photoresist on the first anti-reflection layer 24 and exposing and developing the negative photoresist through the use of a photo mask having an open pattern which light permeates in a region corresponding to the region where the via hole is to be formed. Particularly, to make the width W2 of the second photoresist pattern 25 greater than the width W1 of the via hole 23, a condition of the exposure process is adjusted to make a width of an exposure region greater than the open pattern of the photo mask. For instance, an exposure energy in the exposure process for forming the second photoresist pattern 25 is adjusted to a level greater than that in the exposure process for forming the first photoresist pattern 22.

Figure 2D:
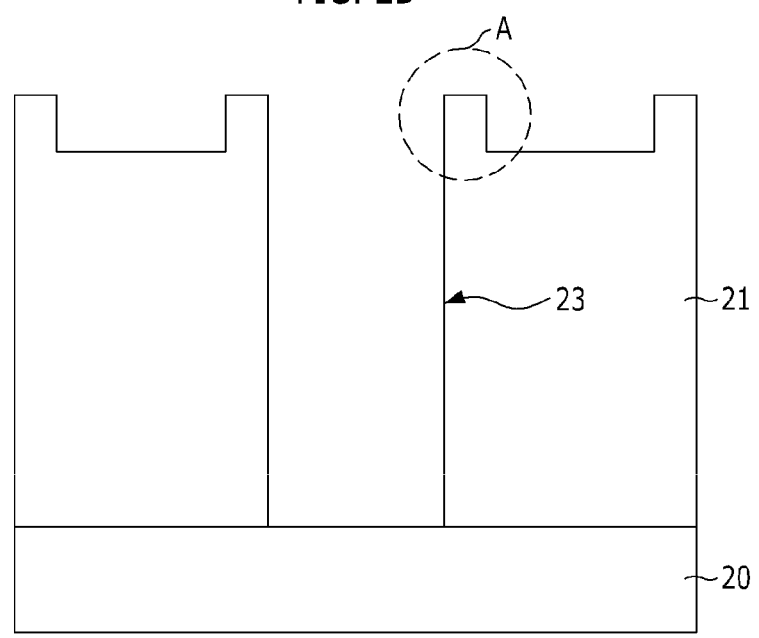

Referring to FIG. 2D, the first anti-reflection layer 24 and the inter-layer dielectric layer 21 are etched up to a certain depth using the second photoresist pattern 25 as an etch barrier. As a result, a portion of the inter-layer dielectric layer 21 at the edge of the via hole 23 protrudes as much as the etched depth than other portions of the inter-layer dielectric layer 21. At this point, the etched depth of the inter-layer dielectric layer 21 is smaller than a depth of a subsequent trench. Preferably, the etched depth of the inter-layer dielectric layer 21 is in a range of approximately 100 Å to approximately 2,000 Å.

After then, the first anti-reflection layer 24 and the second photoresist pattern 25 are removed.

Figure 2E:
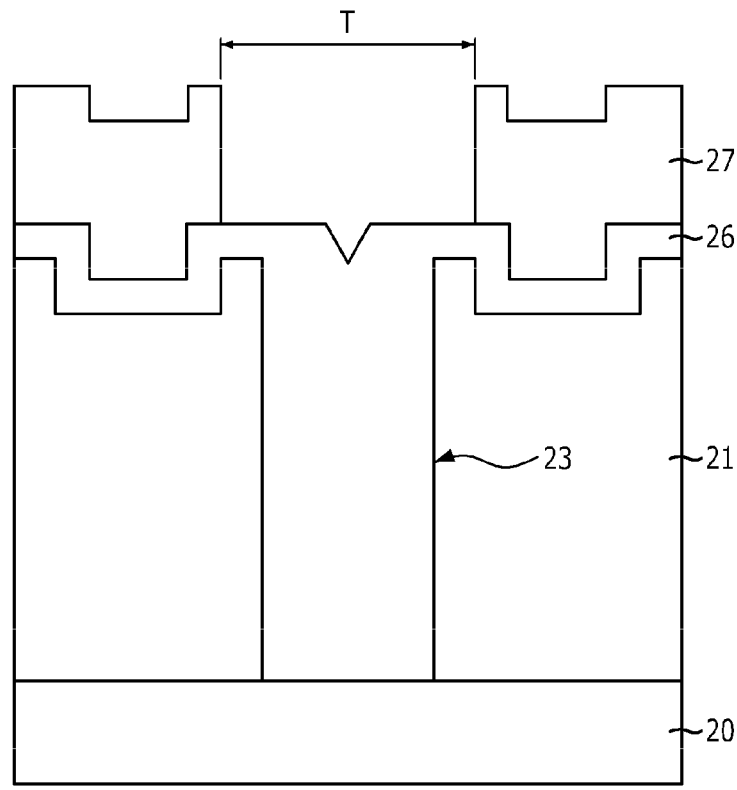

Referring to FIG. 2E, a second anti-reflection layer 26 filling the via hole 23 is formed on a whole surface of a resultant structure including the via hole 23. The second anti-reflection layer 26 prevents the light from being reflected in the exposure process of the photoresist and, at the same time, serves as a barrier to prevent the conducting layer 20 exposed according to the formation of the via hole 23 from being damaged in a subsequent process. As described above, since the portion of the inter-layer dielectric layer 21 at the edge of the via hole 23 protrudes higher than other portions of the inter-layer dielectric layer 21, a thickness of the second anti-reflection layer 26 at the edge of the via hole 23 increases compared to the prior art. The second anti-reflection layer 26 may be formed to have a target thickness of approximately 500 Å to approximately 2,000 Å.

Subsequently, a third photoresist pattern 27 for forming a trench is formed on the second anti-reflection layer 26. Herein, a reference numeral 'T' represents a region where a trench is to be formed and the via hole 23 is overlapped with the region T. That is, the via hole 23 is disposed under the region T.

Figure 2F:
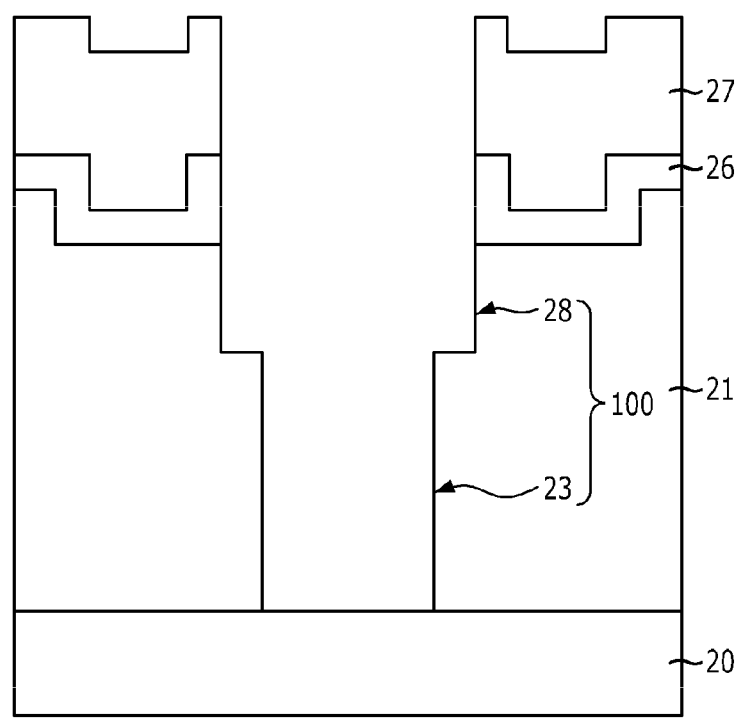

Referring to FIG. 2F, a trench 28 is formed by etching the second anti-reflection layer 26 and the inter-layer dielectric layer 21 up to a certain depth using the third photoresist pattern 27 as an etch barrier. At this point, since the portion of the inter-layer dielectric layer 21 at the edge of the via hole 23 protrudes, the collapse of the inter-layer dielectric layer 21 when performing the etching process of forming the trench 28 is minimized and thus it is possible to obtain a desired profile of the trench 28. As a result of the process described in FIG. 2F, a dual damascene pattern 200 including the trench 28 and the via hole 23 overlapped within the trench 28 is formed in the inter-layer dielectric layer 21.

Figure 2G:
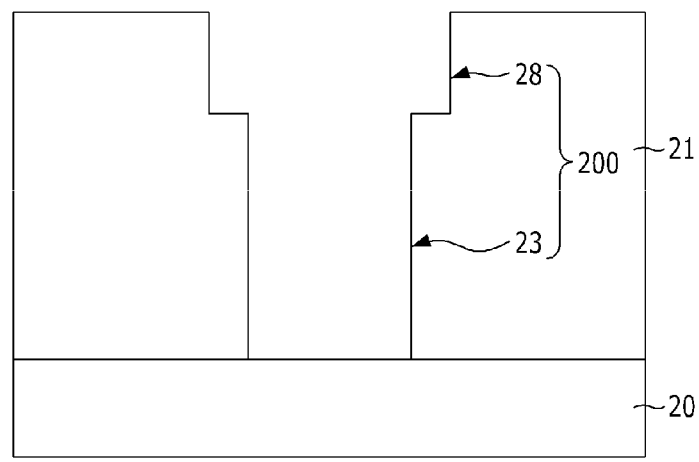

Referring to FIG. 2G, the second anti-reflection layer 26 and the third photoresist pattern 27 are removed.

Figure 2H:
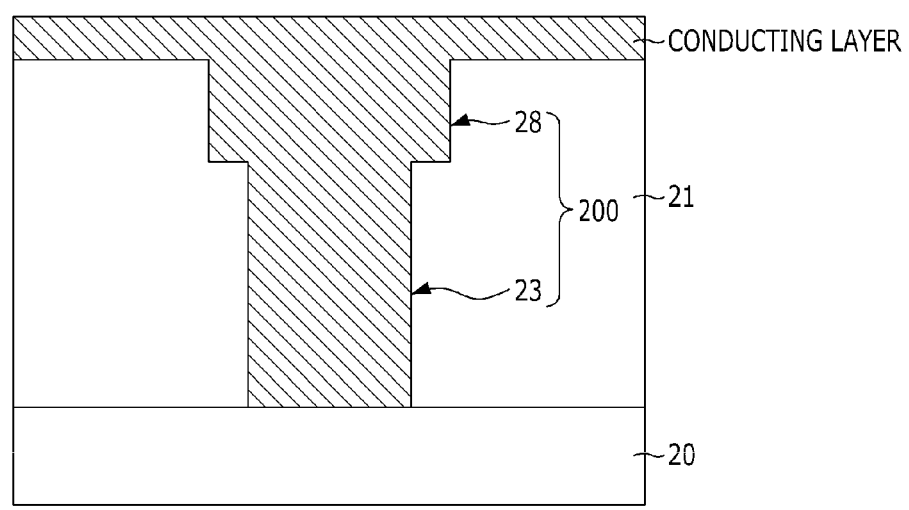
Figure 2I:
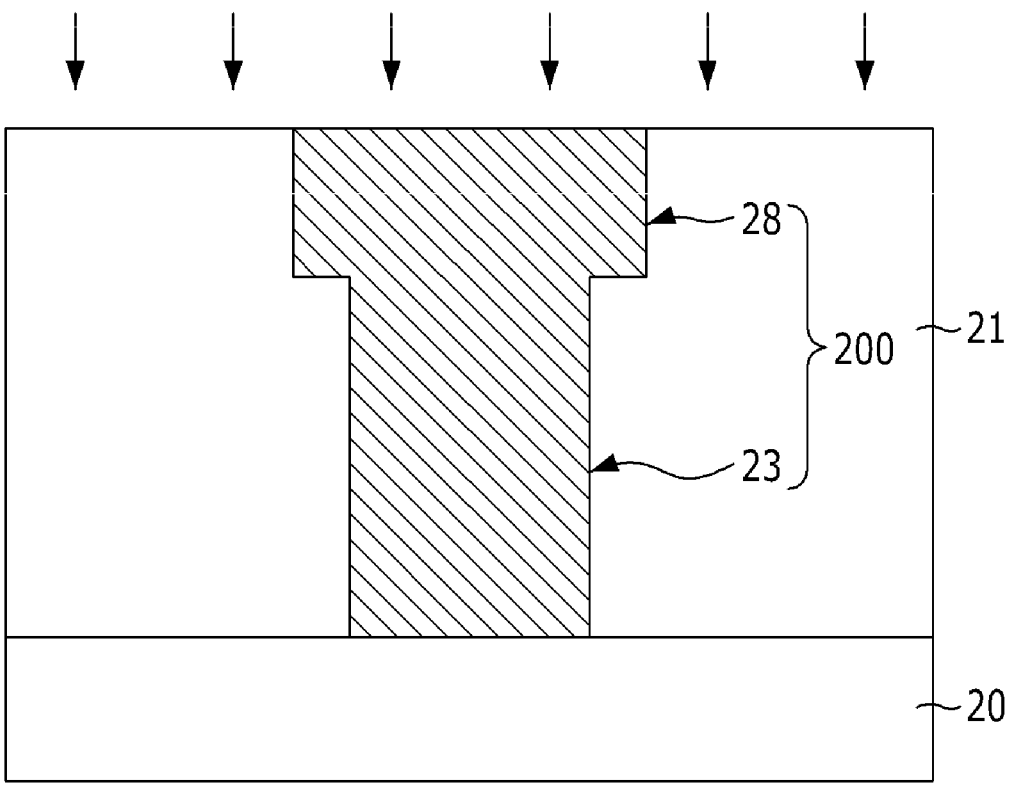

Then, as shown in FIGS. 2H and 2I, a line having a shape of the dual damascene pattern 200 may be formed in the inter-layer dielectric layer 2I by depositing a conducting layer for the line formation such as copper on a whole surface of a resultant structure including the dual damascene pattern 200 and performing a planarization process such as a CMP process until the inter-layer dielectric layer 21 is exposed.

In accordance with the present invention, it is possible to prevent the inter-layer dielectric layer at the edge of the via hole from collapsing in the process of forming the subsequent trench by projecting the portion of the inter-layer dielectric layer at the edge of the via hole than other portions of the inter-layer dielectric layer.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device using a dual damascene process, the method comprising:
    forming a dielectric layer over a conductive layer;
    forming a via hole exposing the conducting layer by selectively etching the dielectric layer;
    forming a second photoresist pattern covering the via hole and a portion of the dielectric layer adjacent to sidewalls of the via hole;
    selectively etching the dielectric layer to a first depth using an entirety of the second photoresist pattern as an etch mask, thereby projecting the portion of the dielectric layer adjacent to the sidewalls of the via hole above a top surface of the etched dielectric layer; and
    forming a trench by selectively etching the projected portion of the dielectric layer to a second depth, wherein the trench is overlapped with the via hole to form a dual damascene pattern.

2. The method of claim 1, wherein the forming of the second photoresist pattern comprises:
    forming an anti-reflection layer on a whole surface of the dielectric layer including the via hole;
    coating negative photoresist on the anti-reflection layer; and
    exposing and developing the negative photoresist through the use of a photo mask having an open pattern which is a first region corresponding to a second region where the via hole is formed, wherein a width of a region of the negative photoresist exposed by light is greater than that of the open pattern of the photo mask.

3. The method of claim 2, wherein the forming of the via hole comprises:
    coating positive photoresist on the dielectric layer;
    forming a first photoresist pattern by exposing and developing the positive photoresist using the photo mask; and
    etching the dielectric layer using the first photoresist pattern as a first etch mask.

4. The method of claim 3, wherein an exposure energy in the process of forming the second photoresist pattern is greater than that in the process of forming the first photoresist pattern.

5. The method of claim 1, wherein the second depth is greater than the first depth.

6. The method of claim 1, wherein the forming of the trench comprises:
    forming an anti-reflection layer on a whole surface of the projected dielectric layer including the via hole;
    forming a third photoresist pattern for forming the trench on the anti-reflection layer; and
    etching the projected portion of the dielectric layer to the second depth using the third photoresist pattern as a third etch mask.

7. The method of claim 6, wherein a thickness of the dielectric layer is in a range of approximately 8,000 Å to approximately 15,000 Å; the first depth is in a range of approximately 100 Å to approximately 2,000 Å; and a thickness of the anti-reflection layer is in a range of approximately 500 Å to approximately 2,000 Å.

8. The method of claim 1, after the forming of the dual damascene pattern, further comprising:
    forming a conducting layer on a whole surface of the dielectric layer including the dual damascene pattern; and
    forming a conducting pattern having a shape of the dual damascene pattern by performing a planarization process until the dielectric layer is exposed.

9. The method of claim 1, wherein a thickness of the dielectric layer is in a range of approximately 8,000 Å to approximately 15,000 Å and the first depth is in a range of approximately 100 Å to approximately 2,000 Å.

* * * * *